United States Patent [19]
Estes

[11] Patent Number: 5,614,698
[45] Date of Patent: Mar. 25, 1997

[54] CIRCUIT BOARD APPARATUS WITH INTEGRAL, EDGE-READABLE BAR CODE STRUCTURE, AND ASSOCIATED METHODS

[75] Inventor: H. Scott Estes, Austin, Tex.

[73] Assignee: Dell USA, L.P., Austin, Tex.

[21] Appl. No.: 374,315

[22] Filed: Jan. 17, 1995

[51] Int. Cl.[6] ............................................. H05K 1/00
[52] U.S. Cl. .................. 174/250; 174/255; 364/237.85; 29/829; 29/846
[58] Field of Search ..................................... 174/250, 255; 361/749; 235/462; 364/237.85; 29/829, 830, 846, 848, 849, 738, 705

[56] References Cited

U.S. PATENT DOCUMENTS

| | | | |
|---|---|---|---|
| 5,244,395 | 9/1993 | De Santis et al. | 439/65 |
| 5,376,759 | 12/1994 | Marx et al. | 174/255 |
| 5,528,825 | 6/1996 | Miyauchi et al. | 29/837 |
| 5,539,976 | 7/1996 | Miyauchi et al. | 29/740 |

Primary Examiner—Laura Thomas
Attorney, Agent, or Firm—Henry N. Garrana; Mark P. Kahler; Diana L. Roberts

[57] ABSTRACT

The substrate member of a multi-tier circuit board is provided, during the construction thereof, with an integral bar code structure by extending spaced apart, parallel finger sections of an interior metal ground plane portion of a panel structure outwardly past the routing path along which the substrate member is to be separated from the panel structure. After the substrate member is routed from the panel structure it has a peripheral side edge portion upon which exposed end surface portions of the spaced ground plane finger sections are disposed in a mutually spaced bar code array representative of predetermined information relating to the completed circuit board. The ground-seeking probe portion of a conductive scanning device is moved along the bar-coded edge of the substrate member to read and decipher the integral ground plane bar code structure compactly incorporated thereon during the manufacture of the substrate member.

16 Claims, 2 Drawing Sheets

5,614,698

CIRCUIT BOARD APPARATUS WITH INTEGRAL, EDGE-READABLE BAR CODE STRUCTURE, AND ASSOCIATED METHODS

BACKGROUND OF THE INVENTION

The present invention generally relates to circuit boards, and more particularly relates to bar code apparatus and methods used to provide a user of a circuit board with technical and other identifying information relative to the board subsequent to its manufacture.

To provide a variety of identification and technical information, such as part number, revision, day code, manufacturer, etc. for a circuit board, it is conventional for the board manufacturer to place one or more bar code stickers on a side surface of the board. The theory is that, like a bar-coded grocery item, the circuit board may later be optically scanned to provide, via the bar code sticker, a user subsequently incorporating the board into a product, such as a computer, with a readout of the encoded information.

While this board-identifying technique appears at first glance to be quite simple and straightforward, it is subject to various well known problems, limitations and disadvantages. For example, since the adhesive bar code stickers are separate from the boards that they must subsequently identify, it is possible for one or more incorrect stickers to be applied to a given circuit board. Additionally, relatively large electronic components mounted on the sticker side of the board can "shade" an adjacent bar code sticker from the beam of the scanner used to decipher it, thereby hindering the retrieval of bar code information from the board. Moreover, particularly in very dense circuit board designs such as in notebook computer and pager boards, the use of several bar code stickers on a side surface of the board tends to occupy an undesirably large side surface area that could otherwise be used for additional electronic components, surface traces and the like.

As can readily be seen from the foregoing, it would be highly desirable to incorporate in a circuit board an improved scannable bar code type structure and associated methods that provide desired information about the circuit board while at the same time eliminate or at least substantially reduce the above-mentioned problems, limitations and disadvantages typically associated with conventional side-surface mounted scannable bar code structures as generally described above. It is accordingly an object of the present invention to provide such improved circuit board bar code structure and methods.

SUMMARY OF THE INVENTION

In carrying out principles of the present invention, in accordance with a preferred embodiment thereof, the dielectric substrate structure of a circuit board has oppositely facing first and second sides, and a peripheral side edge portion extending between the first and second sides. An electrically conductive portion is carried by the dielectric substrate structure, lies generally in a plane parallel to its first and second sides, and is inwardly offset from the peripheral side edge portion of the substrate structure.

The electrically conductive portion, which is preferably an interior ground plane portion of the circuit board formed from copper plating, has spaced apart finger sections that extend outwardly therefrom and have spaced apart outer end surfaces aligned with the peripheral side edge portion of the substrate structure. These spaced apart outer end surfaces, and the spaces between them, are arranged on the peripheral side edge portion of the substrate structure in a bar code orientation indicative of predetermined information relating to the circuit board. The bar code structure formed on the peripheral side edge surface of the substrate structure may be scanned, preferably using a conductive scanner run along the substrate side edge surface, to quickly retrieve the circuit board information.

The substrate structure with its integral side edge bar code pattern may be conveniently formed by providing a panel, made up from alternating dielectric and electrically conductive material layers, from which the substrate structure may be separated along, for example, a routing path on the panel. The spaced finger sections of the selected electrically conductive layer are configured to extend outwardly across the routing path so that when the substrate structure is routed from the panel, exposed outer end surfaces of the now shortened finger sections are cleanly exposed along the peripheral side edge surface of the separated substrate structure in the aforementioned edge-readable bar code array.

DETAILED DESCRIPTION

Figure 1:
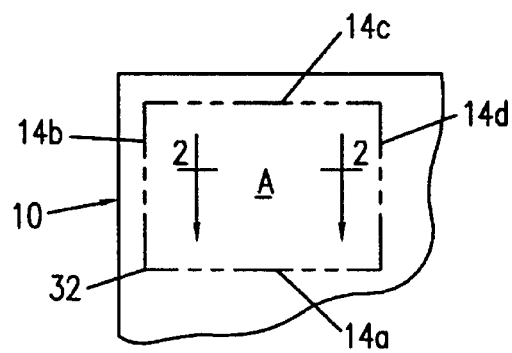
FIG. 1 is a simplified top plan view of a portion of a representative manufacturing panel from which a multi-tier substrate portion of a circuit board is to be cut along the indicated routing lines.

Illustrated in FIG. 1 is a representative multi-tier substrate panel structure 10 from which a generally rectangular multi-tier circuit board substrate member 12 (see FIGS. 4 and 5) may be formed by routing the panel 10 along the rectangular routing path 14a, 14b, 14c, 14d to remove the portion "A" therefrom. The substrate member 12 forms a portion of a circuit board 16 subsequently described herein in greater detail.

Figure 2:
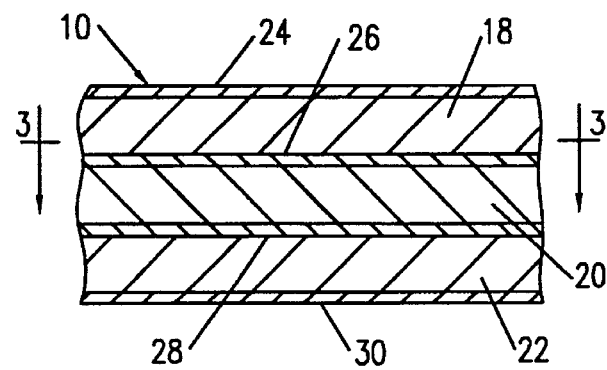
FIG. 2 is an enlarged scale partial cross-sectional view through the panel taken along line 2—2 of FIG. 1.

Referring now to FIG. 2, the substrate area "A" within panel 10 is representatively made up, in cross-section, of three vertically stacked layers of dielectric material 18, 20 and 22 interdigitated with four conductive metal layers—a top side layer 24, an interior ground plane layer 26, an interior signal plane layer 28, and a bottom side layer 30—each of which is preferably of a copper plating material suitably masked and etched during the panel build-up process to form the desired conductive layer configuration of each "tier" in the finished multi-tier circuit board 16.

Figure 3:
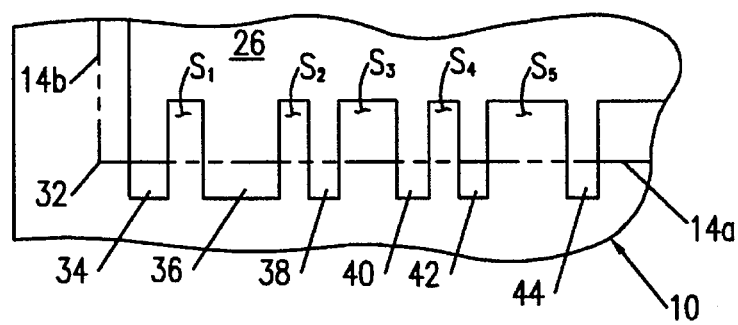
FIG. 3 is an enlarged scale partial cross-sectional view through the panel taken along line 3—3 of FIG. 2.

As illustrated in FIG. 3, the ground plane 26 is, for the most part, inwardly offset from the routing path 14a, 14b, 14c, 14d in the panel 10 except adjacent the routing path corner 32 at the juncture of the routing lines 14a and 14b. Adjacent this corner, the electrically conductive metal ground plane 26 has a mutually spaced series of rectangular finger sections 34, 36, 38, 40, 42 and 44 that project outwardly from the main ground plane body past the routing line 14a. These six finger sections have varying widths parallel to the routing line 14a, and are separated in a direction parallel to the routing line 14a by varying width spaces $S_1-S_5$ as indicated in FIG. 3. The correlation between and among the widths of the finger sections 34–44, and the widths of the spaces $S_1-S_5$ therebetween, is predetermined to combinatively form a bar code type indicia representing various information regarding the subsequently formed circuit board 16 such as, for example, its part number, revision, day code, manufacturer, and the like.

Figure 4:
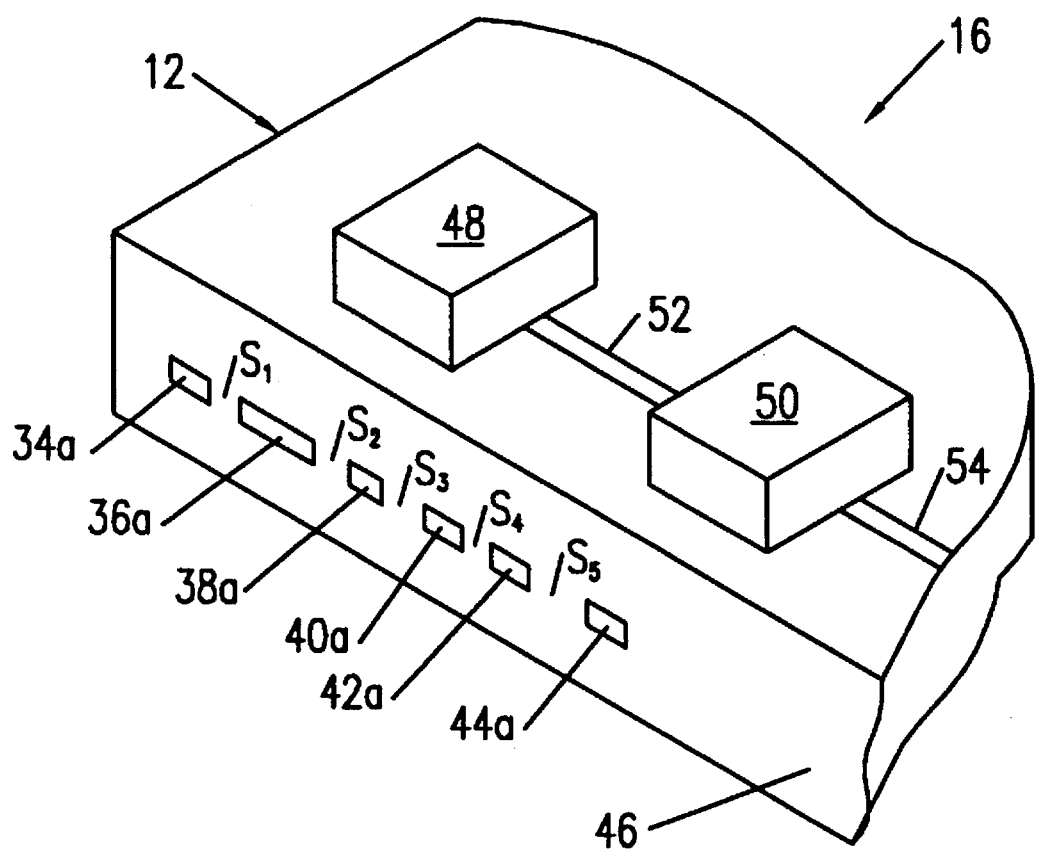
FIG. 4 is an enlarged scale perspective view of a portion of a circuit board manufactured using a multi-tiered substrate portion removed from the panel, and illustrates an integral, edge readable bar code structure formed on the substrate portion of the circuit board.

When the rectangular portion "A" is subsequently routed out from the panel 10 to form the substrate member 12 of the circuit board 16 (see FIG. 4), the panel surface revealed by the routing along line 14a forms on the substrate member 12 an outer side edge portion 46 having disposed thereon exposed end faces 34a, 36a, 38a, 40a, 42a and 44a of the corresponding ground plane finger sections 34, 36, 38, 40, 42 and 44 which were somewhat shortened as a result of separating cut along the routing line 14a. These exposed ground plane finger section end faces 34a–44a are flush with the substrate outer edge surface 34 and are mutually separated by the separation widths $S_1-S_5$ as indicated in FIG. 4.

Accordingly, as viewed perpendicularly toward the substrate edge portion 46, the vertically aligned exposed finger section end faces 34a–44a, and the horizontal spaces $S_1-S_5$ therebetween, combinatively define a bar code array indicative of the desired circuit board manufacturing and/or technical information. After the multi-tier substrate member 12 is separated from the panel 10, which may have a number of additional substrate members thereon that may be separated therefrom, the circuit board 16 is completed by operatively mounting the desired electronic components thereon, such as the components 48, 50 illustrated in FIG. 4, on the top and/or bottom sides of the substrate member 12 and connecting the components using previously formed electrically conductive surface traces such as the traces 52, 54.

Figure 5:
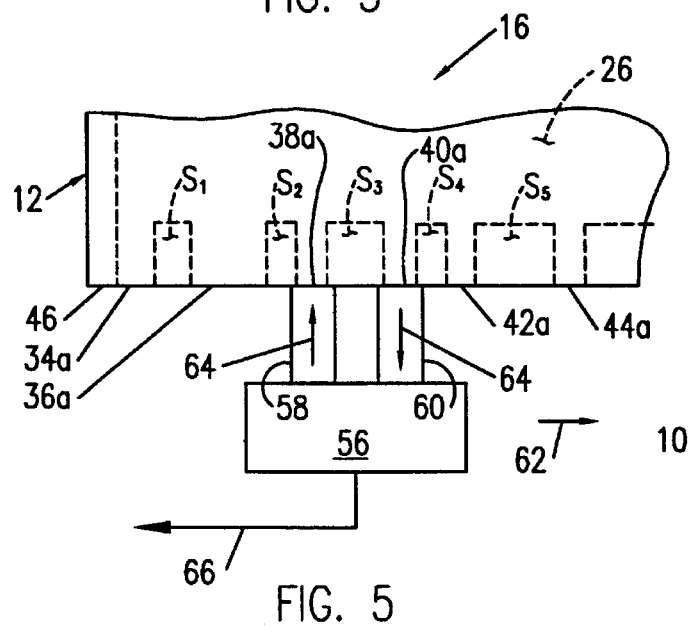
FIG. 5 is a top plan view of the FIG. 4 circuit board portion schematically illustrating a scanning device being used to read its integral bar code structure.

As schematically depicted in FIG. 5, the bar code indicia formed on the substrate side edge 46 by the exposed ground plane finger section end faces 34a–44a and the intervening spaces $S_1-S_5$ may be read using a simple conductive scanning device 56 having a horizontally spaced pair of conductive probe portions 58 and 60. The device 56 is used by moving the probes 58, 60 horizontally along the substrate side edge 46, as indicated by the arrow 62, along the bar code indicia thereon.

When both probes engage an exposed copper end face portion of the ground plane 26, an electrical current 64 flows outwardly from the device 56 through the probe 58, passes through the ground plane 26, and flows back into the device 56 through the probe 60. Conversely, when either or both of the probes 58, 60 enters one of the spaces $S_1-S_5$, and is conductively disengaged from the ground plane 26, the current 64 ceases. As this conductive scanning process takes place, the device 56 converts the sensed current information to an output signal 66 indicative of the scanned bar code information. The output signal 66 may be used to create for the user of the scanning device 56 a visual readout display of the scanned information.

As can readily be seen from the foregoing, using conventional construction methods the present invention provides a circuit board 16 in which an edge-readable bar code structure is integrally incorporated and may be easily and quickly read by an inexpensive conductive scanning device utilizing a ground-seeking probe portion moved along and against the bar-coded substrate edge portion of the circuit board. The integral incorporation of such an edge-readable bar code structure into the substrate portion of a circuit board provides several advantages over the conventional approach of placing adhesive bar code stickers on a substrate side surface, and then optically scanning the stickers at a later date to provide information regarding the circuit board.

For example, since the bar code structure is not separate from the overall circuit board structure, but is integrally incorporated therein, the possibility of misidentifying the circuit board is substantially eliminated. Additionally, no surface area on either side of the board substrate is required by the bar code structure of the present invention—it occupies only a small area of a peripheral edge portion of the substrate. Moreover, none of the electronic components mounted on either side of the board substrate can "shade" or otherwise interfere with the scanning of the integral bar code structure of the present invention.

While the integral bar code structure of the present invention is preferably a portion of the interior ground plane tier 26 of the circuit board structure, it will be readily appreciated by those of skill in this particular art that it could alternatively be incorporated in one of the other tiers 24, 28 and 30 if desired. In this event, of course, the spaced apart finger sections used to form the exposed conductive bar code sections on the substrate edge periphery would have to be interconnected by a conductive plating segment that was electrically isolated from the balance of the metal plating structure forming the particular conductive tier of the multitiered circuit board substrate.

Also, while the scanning of the integral edge-readable bar code structure of the present invention has been representatively illustrated as a conductive, ground seeking process, it will be readily appreciated by those of skill in this particular art that the edge process could alternatively be an electrically inductive scanning process or an optical scanning process if desired.

The foregoing detailed description is to be clearly understood as being given by way of illustration and example only, the spirit and scope of the present invention being limited solely by the appended claims.

What is claimed is:

1. Circuit board apparatus comprising:
    a dielectric substrate structure having oppositely facing first and second sides, and a peripheral side edge portion extending between said first and second sides; and
    an electrically conductive portion carried by said dielectric substrate structure, lying generally in a plane parallel to said first and second sides, and being inwardly offset from said peripheral side edge portion, said electrically conductive portion having spaced apart finger sections extending outwardly therefrom and having spaced apart outer end surfaces aligned with said peripheral side edge portion,
    said spaced apart outer end surfaces, and the spaces between them, being arranged on said peripheral side edge portion in a bar code orientation indicative of predetermined information relating to said circuit board apparatus.

2. The circuit board apparatus of claim 1 wherein:
    said electrically conductive portion is disposed within an interior portion of said dielectric substrate structure.

3. The circuit board apparatus of claim 2 wherein:
    said electrically conductive portion is a ground plane portion of said circuit board apparatus.

4. Circuit board apparatus comprising:

a generally plate-like substrate member having a peripheral side edge surface; and an electrically conductive portion disposed within the interior of said substrate member and having spaced apart sections extending outwardly through said side edge surface to form thereon a conductively scannable bar code pattern indicative of predetermined information relating to said circuit board apparatus.

5. The circuit board apparatus of claim 4 wherein:

said electrically conductive portion is a ground plane portion of said circuit board apparatus.

6. The circuit board apparatus of claim 5 wherein:

said spaced apart sections are generally rectangularly cross-sectioned finger sections of said ground plane portion extending outwardly through said peripheral side edge surface.

7. A method of fabricating a circuit board, said method comprising the steps of:

forming a substrate structure having a dielectric portion with oppositely facing, parallel, generally planar first and second sides, and a peripheral side edge portion extending between said first and second sides;

supporting on said substrate structure an electrically conductive portion lying generally in a plane parallel to said first and second sides; and utilizing sections of said electrically conductive portion to form on said peripheral side edge portion a bar code structure indicative of predetermined information relating to said circuit board.

8. The method of claim 7 wherein:

said supporting step is performed in a manner such that said electrically conductive portion is inwardly offset from said peripheral side edge portion, and said utilizing step is performed by extending a spaced series of finger sections of said electrically conductive portion outwardly through said peripheral side edge portion in a manner such that the finger sections have, on said peripheral side edge portion, a spaced series of exposed outer end surfaces which, with spaces on said peripheral side edge portion between said exposed outer end surfaces, define said bar code structure.

9. The method of claim 8 wherein:

said supporting step is performed in a manner such that said electrically conductive portion is disposed within the interior of said substrate structure.

10. The method of claim 9 wherein:

said electrically conductive portion is a ground plane portion of said circuit board, and said supporting step includes the step of depositing on said substrate structure a metal plating material.

11. The method of claim 10 wherein:

said depositing step is performed using a copper plating material.

12. A method of fabricating a circuit board, said method comprising the steps of:

forming a multilayer panel structure defined by alternating layers of dielectric material and electrically conductive material, the panel structure having a substrate portion thereon which may be separated at its periphery from said panel structure, one of said layers of electrically conductive material having a portion inwardly offset from said periphery of said substrate portion and from which a spaced series of finger sections extend lengthwise outwardly across the periphery of said substrate portion, the widths of said finger sections and of the spaces therebetween combinatively defining a bar code array indicative of predetermined information about the circuit board;

separating said substrate portion at said periphery thereof from the balance of said panel structure to form a substrate member having a peripheral side edge portion having disposed thereon exposed outer end portions of said finger sections mutually spaced apart from one another in a scannable bar code array.

13. The method of claim 12 wherein:

said forming step is performed in a manner such that said one of said electrically conductive layers is disposed within the interior of said multilayer panel structure.

14. A method of obtaining information with respect to a circuit board having a dielectric substrate structure with opposite, generally parallel first and second sides, and a peripheral side edge portion extending between said first and second sides, and an electrically conductive portion carried by said dielectric substrate structure and lying in a plane parallel to said first and second sides, said method comprising the steps of:

forming a scannable bar code array on said peripheral side edge by extending spaced apart sections of said electrically conductive portion outwardly through said peripheral side edge portion into a generally flush relationship therewith, said bar code array being indicative of said information; and scanning said bar code array to obtain said information.

15. The method of claim 14 wherein:

said scanning step is performed using a conductive scanning process along said peripheral side edge.

16. The method of claim 14 wherein:

said forming step is performed in a manner such that said spaced apart finger sections are inwardly spaced apart from each of said first and second sides of said substrate structure.

* * * * *